United States Patent
Moriyama et al.

(10) Patent No.: US 8,242,689 B2
(45) Date of Patent: Aug. 14, 2012

(54) ORGANIC ELECTROLUMINESCENCE DISPLAY DEVICE

(75) Inventors: Takashi Moriyama, Funabashi (JP); Noriyuki Shikina, Ichihara (JP); Nobuhiko Sato, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/197,982

(22) Filed: Aug. 4, 2011

(65) Prior Publication Data

US 2012/0038266 A1 Feb. 16, 2012

(30) Foreign Application Priority Data

Aug. 10, 2010 (JP) ................. 2010-179136

(51) Int. Cl.
*H01J 1/62* (2006.01)

(52) U.S. Cl. ....................... 313/504; 313/506

(58) Field of Classification Search .............. 313/498, 313/504, 505, 506
See application file for complete search history.

(56) References Cited

U.S. PATENT DOCUMENTS 5,855,994 A * 1/1999 Biebuyck et al. ............ 428/209

FOREIGN PATENT DOCUMENTS

| JP | 2004-039500 A | 2/2004 |
| JP | 2010-231010 A | 10/2010 |

* cited by examiner

*Primary Examiner* — Vip Patel (74) *Attorney, Agent, or Firm* — Canon U.S.A., Inc. IP Division (57) ABSTRACT

An organic electroluminescence display device includes a plurality of pixels and an array of lenses arranged thereupon. Each pixel includes a light emitting region provided with a lens and a light emitting region provided without a lens. The light emitting regions of each pixel includes an organic electroluminescence material. The lenses are arranged in a staggered pattern.

5 Claims, 6 Drawing Sheets

ORGANIC ELECTROLUMINESCENCE DISPLAY DEVICE

BACKGROUND OF THE INVENTION

1. Field of the Invention

The present invention relates to a display device incorporating an organic electroluminescence (EL) device and, more particularly, to a display device incorporating an organic EL device capable of enhancing light utilization efficiency from the top of the display device.

2. Description of the Related Art

A technical problem for organic EL devices, such as organic light-emitting diodes (OLEDs) is low light extraction efficiency. Light extraction efficiency may be generally defined as the fraction of light radiated outside of the OLED out of the out of the total optical power generated in the active layer (light-emitting layer) of the OLED. In these terms, the extraction efficiency of an organic EL device is low because, since light is emitted at various angles from a light emitting layer in the organic EL device, total reflection components often appear at the interface between a protective layer and an external space and thereby the emitted light is trapped inside the organic EL device. Various configurations have been proposed to overcome this problem. Japanese Patent Laid-Open No. 2004-39500 discloses a configuration for enhancing the light extraction efficiency from the top of an organic EL device by disposing a resin-made lens array on an oxidized silicon nitride ($SiN_xO_y$) film which seals the organic EL device.

In the configuration in which a lens array is situated on an organic EL device disclosed in Japanese Patent Laid-Open No. 2004-39500, a light condensing effect may be produced in addition to an extraction effect of the total reflection components. These effects can enhance brightness (i.e., light emission efficiency) of the display device incorporating an organic EL device by condensing light at the top (center) of each lens in the lens array. In the form disclosed in Japanese Patent Laid-Open No. 2004-39500, however, brightness of the display device in oblique directions (peripheral region of the lens) is low and therefore radiation angle characteristics are negatively affected.

SUMMARY OF THE INVENTION

The present invention provides a display device with wide radiation angle characteristics and improved light utilization efficiency in an organic EL display device.

The present invention is directed to is an organic electroluminescence display device which includes a plurality of pixels each of which includes an organic electroluminescence device and a lens, wherein each pixel includes a light emitting region provided with a lens and a light emitting region provided with no lens; and the lenses situated in the plurality of pixels are arranged in a alternate pattern.

According to the present invention, in an organic EL display device provided with a lens, a lens diameter can be increased for enhanced light collection efficiency. It is therefore possible to provide an organic EL display device with wide radiation angle characteristics kept by a lens and with improved light utilization efficiency.

Further features of the present invention will become apparent from the following description of exemplary embodiments with reference to the attached drawings.

DESCRIPTION OF THE EMBODIMENTS

An organic electroluminescence display device (an organic EL display device) according to the present invention includes a plurality of pixels each of which includes an organic electroluminescence device (an organic EL device) and a lens. Each pixel includes a light emitting region provided with a lens and a light emitting region provided with no lens. The lenses situated in the plurality of pixels are arranged in an alternate (staggered) pattern. Embodiments of the present invention may be implemented at least in the following two configurations in terms of correspondence relationship between the lens and the organic EL device.

In a first configuration, a single pixel is constituted by a single organic EL device; each organic EL device includes a light emitting region provided with a lens and a light emitting region provided with no lens.

In a second configuration, a single pixel includes a plurality of organic EL devices which emit the same colored light; one of the plurality of organic EL devices is situated in the light emitting region provided with a lens and one of other organic EL devices is situated in the light emitting region provided with no lens.

The lens is situated on a light emitting surface side of the organic EL device. The light emitted by the organic EL device is extracted from the light emitting surface. In a conventional organic EL display device, display signals in accordance with gradation are applied to the organic EL device; the minimum unit to which the same display signal is applied is a single pixel. Multicolor display is usually achieved by a combination of red (R) color, green (G) color and blue (B) color. The organic EL device is provided with a light emitting layer which emits light of either of the colors R, G and B. The pixel, as a display unit, is the smallest unit to which the display signal representing R, G or B color is applied; predetermined hues (gradations of color) are displayed by combinations of a red pixel for the R display, a green pixel for G display and a blue pixel for B display.

Hereinafter, the organic EL display device according to the present invention will be described with reference to the embodiments.

Figure 1A:
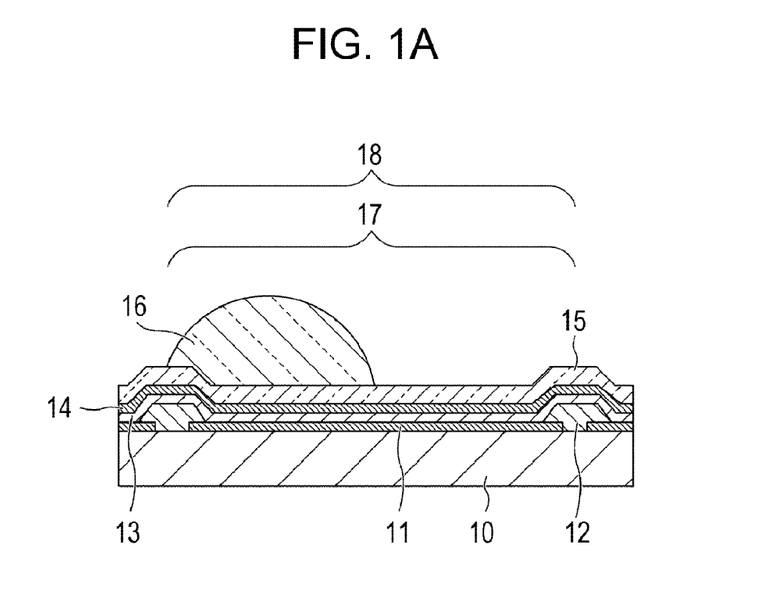
FIG. 1A and FIG. 1B are schematic sectional views illustrating a pixel configuration of an organic EL display device according to the present invention.
Figure 1B:
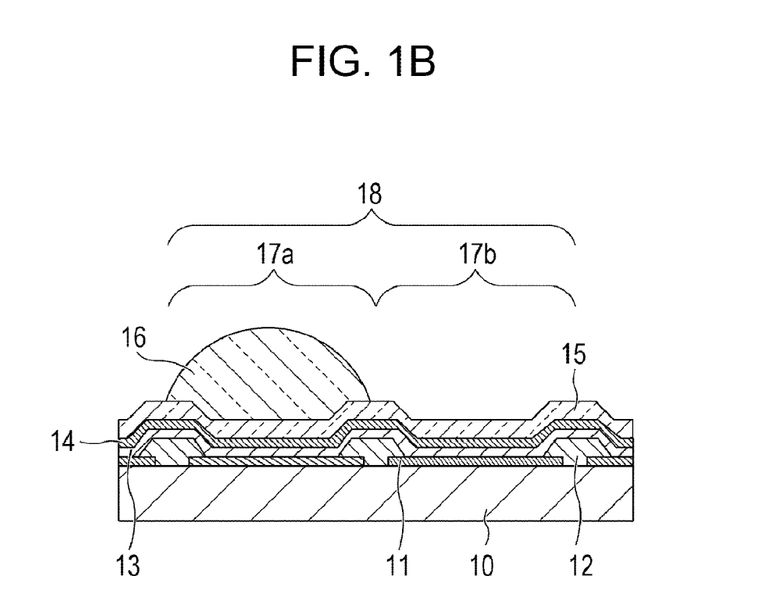

FIGS. 1A and 1B are fragmentary sectional views of portions corresponding to a single pixel related to an embodiment of the organic EL display device according to the present invention; FIG. 1A illustrates the first configuration and FIG. 1B illustrates the second configuration. The first and second configurations each include a substrate 10, organic EL devices 17a, 17b and 17 and partitions 12 which separate the organic EL devices 17a, 17b and 17 from adjacent ones. The partitions 12 separates the organic EL devices 17a, 17b and 17 from one another to define apertures (i.e., light emitting regions) of the organic EL devices 17a, 17b and 17. In the first configuration of the present invention, a single pixel 18 is constituted by a single organic EL device 17 as illustrated in FIG. 1A. In the second form, a single pixel 18 is constituted by a plurality of organic EL devices; in the example of FIG. 1B, the single pixel 18 is constituted by two organic EL devices 17a and 17b.

Each of the organic EL devices 17a, 17b and 17 is provided with an organic compound layer 13 which is situated between a pair of electrodes 11 and 14 and includes a light emitting layer. In particular, each of the organic EL devices 17a, 17b and 17 is provided with a first electrode 11 situated on the substrate 10, the organic compound layer 13 situated on the first electrode 11 and a second electrode 14 situated on the organic compound layer 13. The organic compound layer 13 is a layered product constituted by a single layer or a plurality of layers including a light emitting layer. In particular, for example, the organic compound layer 13 may be four-layered product constituted by a hole transport layer, a light emitting layer, an electron transport layer and an electron injection layer or a three-layered product constituted by a hole transport layer, a light emitting layer and an electron transport layer. Any known materials may be used for the organic compound layer 13 (i.e., an organic light emitting material, a hole transport material, an electron transport material and an electron injection material). Color display is achieved by employing a red light emitting material, a green light emitting material and a blue light emitting material in the light emitting layer.

In the organic EL devices 17a, 17b and 17, the first electrode 11 is provided in each of the devices along a surface direction of the substrate 10; and the second electrode 14 is provided continuously across a plurality of devices. The organic compound layer 13 includes a light emitting layer which differs in configuration in accordance with the color of the emitted light. Accordingly, if adjacent organic EL devices emit light of the same color, the organic EL devices 17a, 17b and 17 have a common light emitting layer; other layers than the light emitting layer are common in the entire organic EL devices. For example, if the pixels of R, G and B are arranged in a striped pattern, the light emitting layers are formed in accordance with the striped pattern. In an arrangement with adjacent organic EL devices being different in color of emitted light, each of the devices includes a light emitting layer.

The substrate 10 is provided with a driving circuit (not illustrated) which actively drives the organic EL devices 17a, 17b and 17. A protective film 15 is provided on the second electrode 14. The protective film 15 is a light transmissive film and may be formed of an inorganic material, such as SiO and SiN or an organic material, such as thermosetting resin and photo-setting resin.

The organic EL devices 17a, 17b and 17 illustrated in FIGS. 1A and 1B are top-emitting devices in which light is extracted from an upper surface of the substrate 10. Accordingly, the first electrode 11 can be formed of a light reflecting electrode material and the second electrode 14 can be formed of a light transmissive or semitransmissive electrode material. Note that the present invention is also applicable to bottom-emitting organic EL devices in which light is extracted from a back surface of the substrate 10. In this case, the first electrode 11 is a light transmissive or semitransmissive electrode and the second electrode 14 is a light reflecting electrode. The lens 16 is formed on the substrate 10 side.

The organic EL display device according to the present invention is manufactured by a known method. The lens 16 illustrated in FIG. 1 is situated on the light emitting surface side via the protective film 15. The lens 16 may have any shape including a spherical shape and a semicylindrical shape. The lens 16 may be formed by processing such materials as transparent thermosetting resin, light curing resin and thermoplastic resin. In particular, the lens 16 may be formed by, for example, embossing. In addition to the embossing, the lens 16 may be formed by either of the following methods (i) to (v):

(i) heat-treating a resin layer which has been patterned through, for example, photolithography, followed by reflowing the resin layer into a lens shape;

(ii) exposing a light curing resin layer of uniform thickness with light distributed in the surface direction, followed by developing the resin layer to form a lens;

(iii) processing a surface of a resin material of uniform thickness into a lens shape using, for example, an ion beam, an electron beam and laser;

(iv) adding a proper amount of resin dropwise to each pixel to form a lens in a self-aligning manner; and (v) preparing a resin sheet on which a lens has been formed, aligning the resin sheet with a substrate on which an organic EL device is formed, and then bonding the resin sheet and the substrate together.

A sealing structure may be achieved by a protective film 15 which has sealability (resistance to diffusion of external elements such as water or moisture) or a sealing film formed on an upper surface of the lens 16. Alternatively, a hollow sealing structure may be used which is achieved by bonding a sealing housing and the substrate 10 which are provided separately.

Figure 2:
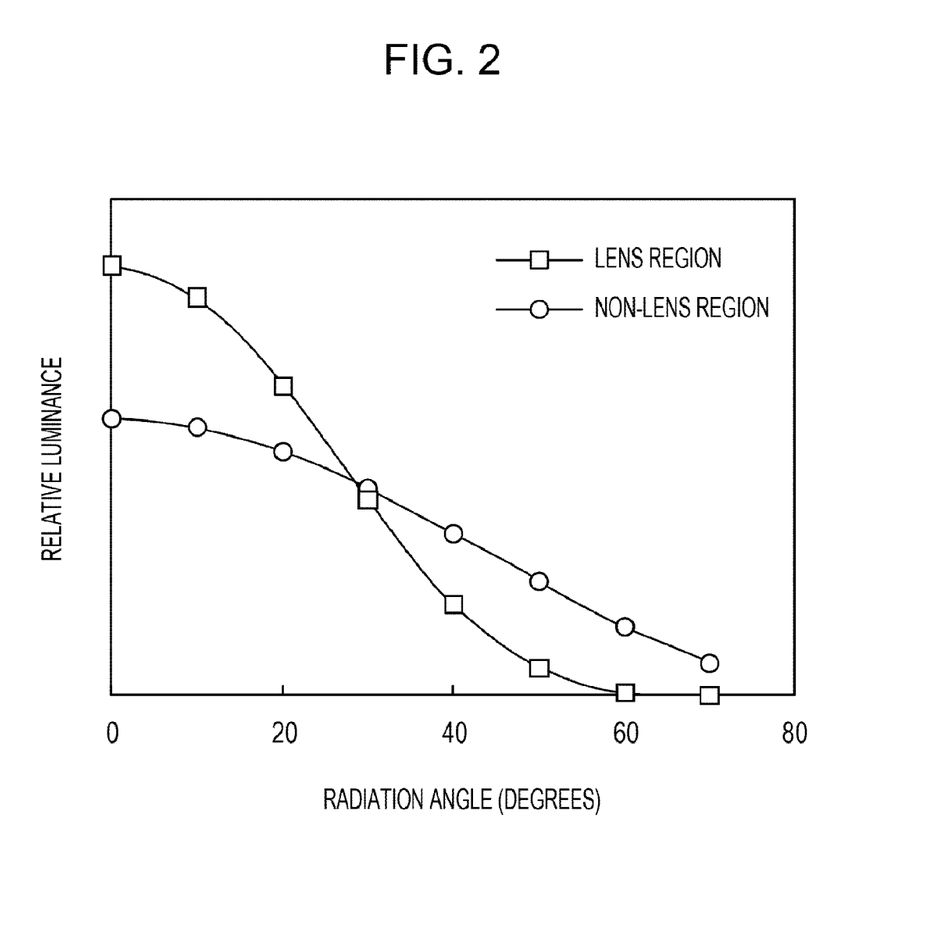
FIG. 2 illustrates radiation angle dependence of brightness in accordance with the existence of a lens in the organic EL display device according to the present invention.

In the organic EL devices 17 and 17a, the light emitted from the organic compound layer 13 (light-emitting region) passes through the second electrode 14 and then the protective film 15 and the lens 16, and exits the organic EL display device in a radiation direction. FIG. 2 illustrates distribution of brightness (relative luminance) as a function of radiation angle for a non-lens region and a lens region of the organic EL display device. Specifically, in FIG. 2, the "lens region" curve corresponds to a brightness distribution in the region where the lens 16 situated on the organic EL device 17 (as illustrated in FIG. 1A); and the "non-lens region" curve corresponds to a brightness distribution in the light emitting region without lens 16. An radiation angle of the light becomes closer to a direction perpendicular to the substrate when the light exits the device from the outermost layer via the lens 16 as compared with a structure in which no lens 16 is provided. Accordingly, the lens region has a higher light collection effect in the vertical direction than the non-lens region does. That is, light extraction efficiency from the top of the organic EL display device can be enhanced up to a certain angle of radiation by using the lens 16. Note that the extent to which the light is collected depends on the lens shape, the curvature, the distance from the light emitting surface to the lens and the light emitting region.

In the organic EL device 17, the light emitted in oblique directions from the organic compound layer 13, meanwhile, exits the device in more oblique directions; this phenomenon is an aid to a further increase in brightness for tilted visual fields.

Figure 3A:
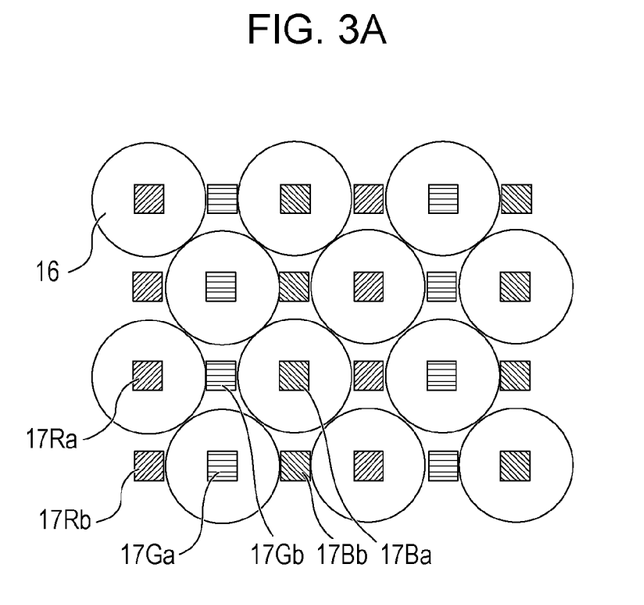
FIG. 3A and FIG. 3B are schematic plan views illustrating an effect of lens arrangement of an embodiment of the organic EL display device according to the present invention.

FIG. 3A is a schematic plan view of an organic EL display device having a pixel configuration illustrated in FIG. 1B. In this example, a multicolor display can be achieved by mixing of the R, G and B colors and the pixels emitting light of each color are arranged in a striped pattern extending the vertical direction of the page. In FIG. 3A, 17Ra and 17Rb represent the organic EL devices for the R color display, 17Ga and 17Gb represent the organic EL devices for the G color display and 17Ba and 17Bb represent the organic EL devices for the B color display. 17Ra and 17Rb constitutes a single pixel, 17Ga and 17Gb constitutes a single pixel and 17Ba and 17Bb constitutes a single pixel.

In the present invention, the lenses 16 are arranged in an alternate (staggered) pattern in which lenses in each row are located between lenses of an adjacent row as illustrated in FIG. 3A. Here, the alternate pattern is a pattern in which, regarding, for example, centroid positions of lenses situated in an arbitrary Pth row, lenses situated in a (P+1)th row and lenses situated in a (P+2)th row are arranged not linearly but alternately.

Figure 3B:
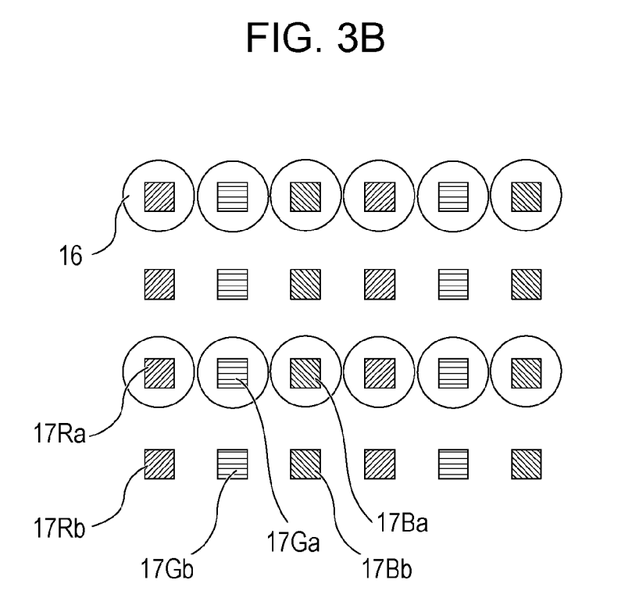

FIG. 3B is a schematic plan view of an organic EL display device in which the lenses 16 are arranged linearly on a substrate on which the organic EL devices are formed in the same pattern as that illustrated in FIG. 3A. In the configuration illustrated in FIG. 3A in which the lenses 16 are arranged alternately staggered), the lens diameter can be increased by nearly 1.6-fold as compared with the configuration illustrated in FIG. 3B. As a result, a range of the lenses 16 which contributes to light collection can be increased by nearly 2.5-fold. Thus, light collection efficiency of the lenses 16 can be better enhanced in FIG. 3A than in FIG. 3B.

Figure 4A:
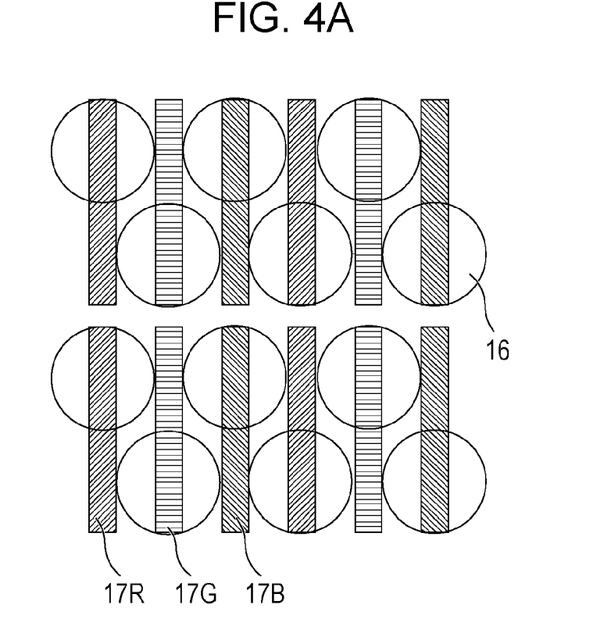
FIG. 4A and FIG. 4B are schematic plan views of another embodiment of the organic EL display device according to the present invention.

FIG. 4A is a schematic plan view of the organic EL display device which has the pixel configuration illustrated in FIG. 1A. Also in this example, pixels of R, G and B color are arranged in a striped pattern extending in the vertical direction of the page. In FIG. 3B, 17R represents the organic EL device for the R color display, 17G represents the organic EL device for the G color display and 17B represents the organic EL device for the B color display. In this example, as illustrated in FIG. 4A, a single pixel includes a single organic EL device and a lens 16 is formed on a light emitting surface side of a part of the organic EL device. In this example, adjacent lenses 16 formed on the organic EL devices 17R, 17G and 17B are displaced from each other (in the vertical direction in FIG. 4A). In this manner, the entire lenses 16 are arranged in an alternate pattern. The light emitting region provided with the lens 16 and the light emitting region provided with no lens 16 may be separated from each other. In this configuration, since edges of the lens 16 are situated on the partitions 12, the difference in level existing at the edges of the lens 16 is reduced and thereby distortion of the lens shape is avoided.

Figure 4B:
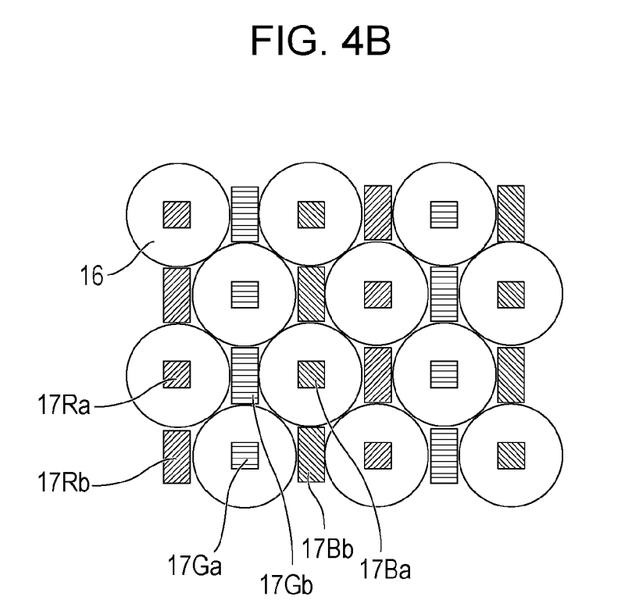

FIG. 4B is a schematic plan view of another embodiment of the organic EL display device having the pixel configuration illustrated in FIG. 1B. It is also possible that the shape of the apertures of the organic EL device 17Ra, 17Ga and 17Ba provided with the lenses 16 and the shape of the apertures of the organic EL device 17Rb, 17Gb and 17Bb provided with no lenses 16 may differ from each other as in this example. In particular, as illustrated in FIG. 4B, an area of the light emitting region provided with the lens can be smaller than that of the light emitting region provided with no lens. This configuration can further enhance the light collection efficiency of the lens.

Figure 5A:
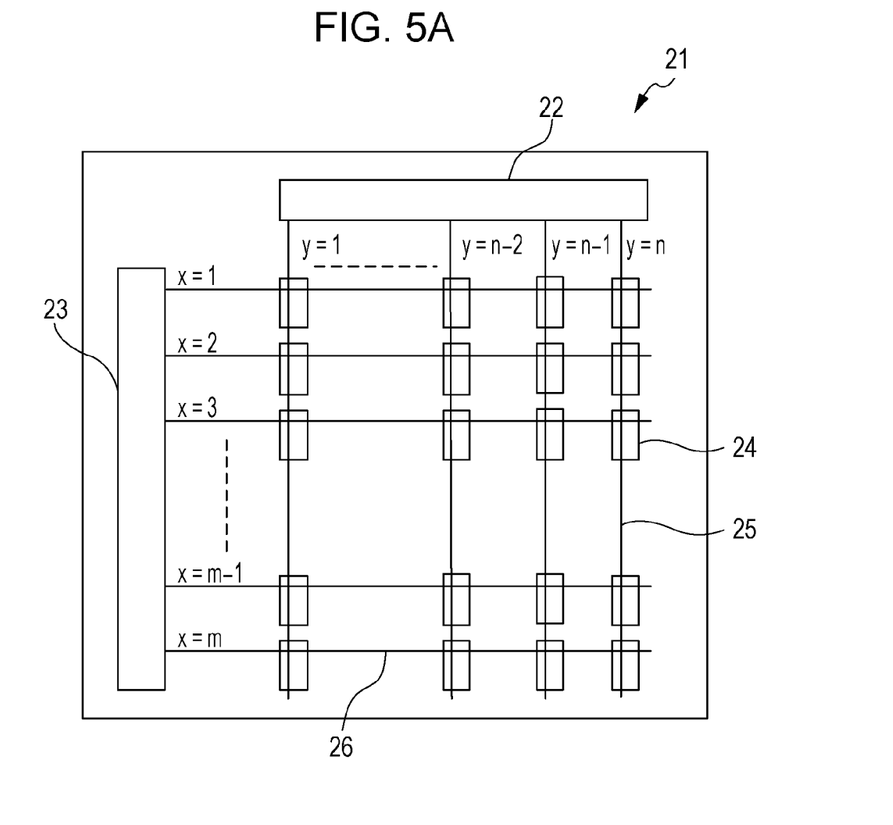
FIG. 5A is a schematic plan view of an embodiment of the organic EL display device according to the present invention.
Figure 5B:
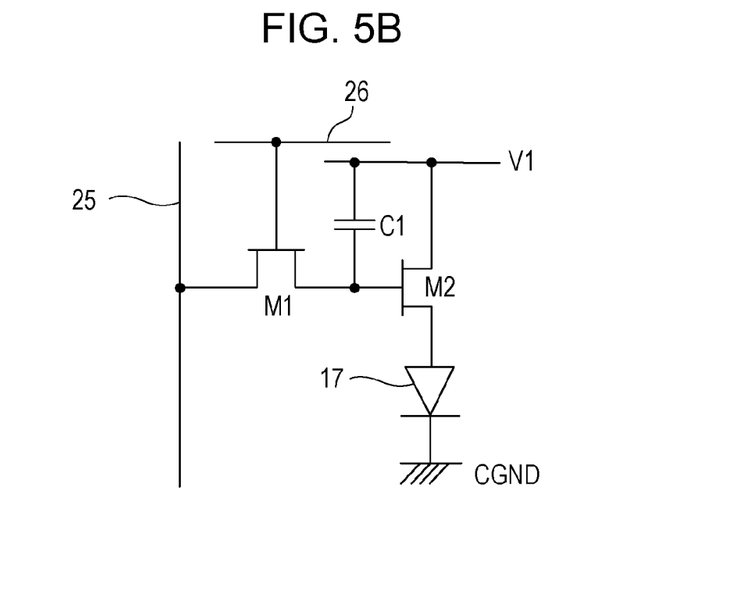
FIG. 5B is a pixel circuit diagram of an embodiment of the organic EL display device according to the present invention.

FIG. 5A is a schematic plan view of an organic EL display device having the pixel configuration illustrated in FIG. 1A. FIG. 5B is a circuit diagram of a single pixel of this organic EL display device. In FIG. 5B, C1 represents capacitance and M1 and M2 represent thin-film transistors (TFTs). An organic EL display device 21 of this example includes n scanning lines 26, m data lines 25 and (m x n) pixel circuits 24 situated at intersections of the scanning lines 26 and the data lines 25 (x represents the scanning line number and y represents the data line number). The scanning lines 26 are driven by a scanning line driving circuit 23. A data line driving circuit 22 applies predetermined information signals (i.e., display signals) to the data lines 25 which, in turn, apply the information signals to the pixel circuits 24.

In the organic EL display device of this example, a single organic EL device 17 corresponds to a single pixel 18 as illustrated in FIG. 1A. Accordingly, a single organic EL device 17 is connected to a single pixel circuit 24 as illustrated in FIG. 5B.

Figure 6A:
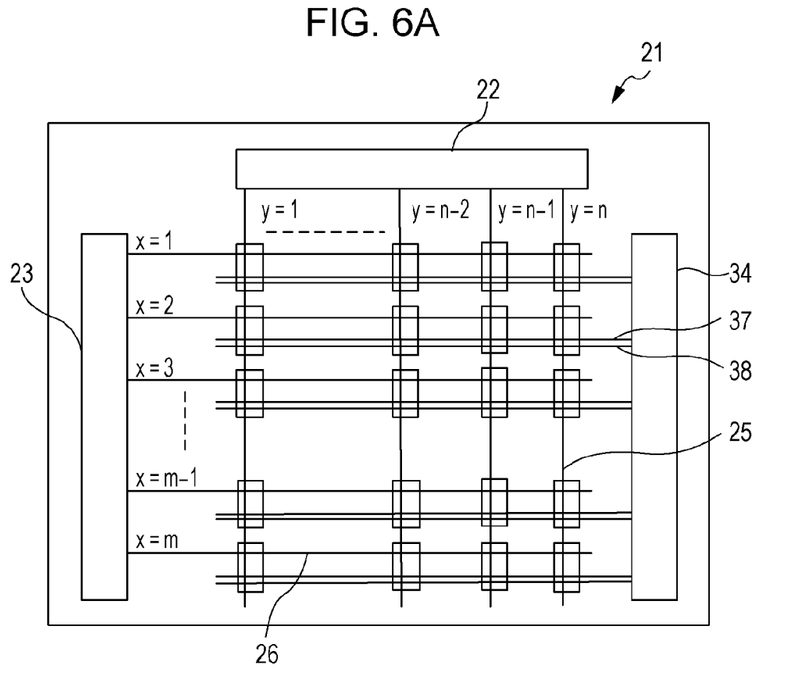
FIG. 6A is a schematic plan view of another embodiment of the organic EL display device according to the present invention.
Figure 6B:
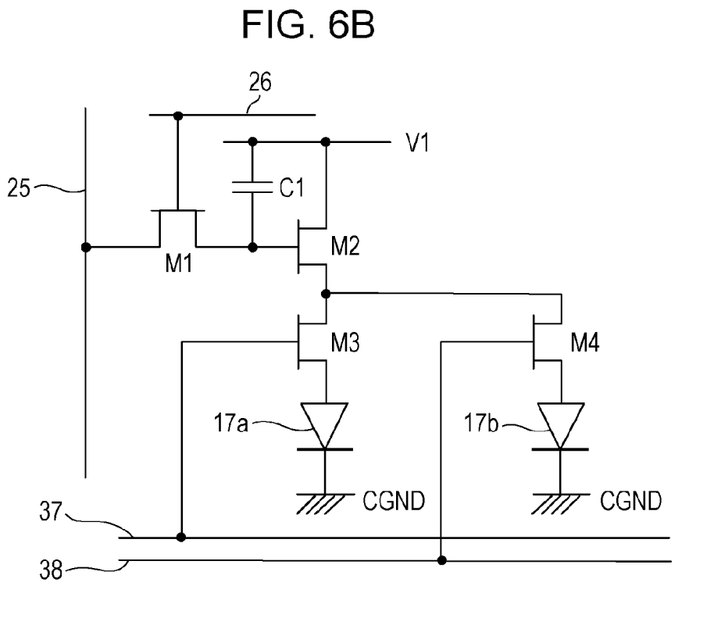
FIG. 6B is a pixel circuit diagram of another embodiment of the organic EL display device according to the present invention.

FIG. 6A is a schematic plan view of an organic EL display device having the pixel configuration illustrated in FIG. 1B. FIG. 6B is a circuit diagram of a single pixel of this organic EL display device. In FIG. 6B, C1 represents capacitance and M1 to M4 represent thin-film transistors (TFTs). This example includes, in addition to the configuration illustrated FIG. 5A, selection control lines 37 and 38 which are parallel to the scanning lines 26 and a selection control line driving circuit 34 which drives the selection control lines 37 and 38. Two organic EL devices 17a and 17b are connected to the pixel circuit 24 to be driven independently.

It is also possible in the organic EL display device having the pixel configuration illustrated in FIG. 1B to include the pixel circuits illustrated in FIG. 5B one on each side of the data lines 25. One of the pixel circuits drives the organic EL device 17a and the other drives the organic EL device 17b. It is also possible, as the first configuration one embodiment of the present invention, to electrically connect the first electrodes 11 of the organic EL devices 17a and 17b which are separated by the partition 12 as illustrated in FIG. 1B and connect one of the first electrodes 11 to the pixel circuit illustrated in FIG. 5B to thereby drive the organic EL devices 17a and 17b simultaneously. In this manner, since the lens regions and the non-lens regions are separated by the partitions 12 and edges of the lens 16 are situated on the partitions 12, the difference in level existing at the edges of the lens 16 is reduced and thereby distortion of the lens shape is avoided.

Next, an operation of the organic EL display device 11 according to the present invention will be described.

In the first configuration of the present invention, the lens region and the non-lens region are driven simultaneously. In the second form, an organic EL device provided with a lens and an organic EL device provided with no lens can be driven simultaneously in an integrated manner as in the first form, and can also be driven independently. Hereinafter, for ease of description, simultaneous driving and independent driving of the organic EL device provided with a lens (i.e., a lens region) and the organic EL device provided with no lens (i.e., a non-lens region) in the second configuration will be described.

If both the lens region and the non-lens region are driven in an integrated manner, with the optical properties illustrated in FIG. 3, the lens region increases brightness at the top and the non-lens region reduces the decrease in brightness in oblique directions; as a result, the radiation angle characteristics are improved. It is therefore possible to keep the radiation angle characteristics while enhancing light utilization efficiency.

If the two regions are driven independently, e.g., if only the non-lens region is turned on, an organic EL display device with wide radiation angle characteristics is achieved. If only the lens region is turned on, an organic EL display device with narrow radiation angle characteristics but high in brightness at the top is achieved. If the brightness of the lens region is substantially the same as that of the non-lens region, the lens region can be driven with a lower current than that required for driving the non-lens region. Thus the device of low power consumption is achieved. Accordingly, either of "wide radiation angle characteristics," "priority on the brightness at the top" or "priority on the low power consumption" of power can be selected as the characteristics of the organic EL display device in accordance with the embodiments of the present invention.

Hereinafter, specific driving methods will be described.

First Driving Method

A first driving method is an exemplary method of driving the organic EL display device illustrated in FIG. 5A which includes the pixel configuration illustrated in FIG. 1A and the pixel circuit illustrated in FIG. 5B. In the circuit illustrated FIG. 5B, M1 and M2 are nMOS transistors (transistors that conduct when the gate is low). If M1 and M2 are pMOS transistors, the high level (H level) and the low level (L level) should be inverted.

In FIG. 5B, scanning selection signals are input from the scanning lines 26 and information signals (i.e., voltage data, Vdata) representing predetermined gradation are input to the data lines 25 in synchronization with the scanning selection signals. The first electrode 11 of the organic EL device 17 is connected to a drain terminal of M2 and the second electrode 14 is connected to ground potential CGND.

When this circuit is selected, H level signals are input to a gate terminal of M1 as scanning signals from the scanning lines 26 and the V data produces voltage in accordance with current drive capacity of M1 in C1 situated between a gate terminal of M2 and power supply potential V1. Next, when the organic EL device 17 is supplied with an electric current in accordance with the written Vdata, L level signals are input to the scanning lines 26. As a result, M1 is turned off and the organic EL device is provided with an electric current in accordance with current drive capacity of M2 by the voltage produced in C1 and the organic EL device 17 emits light of brightness in accordance with the supplied electric current.

Since both the lens region and the non-lens region are driven in an integrated manner in this example, with the optical properties illustrated in FIG. 3, the lens region increases brightness at the top and the existence of the non-lens region reduces the decrease in brightness in oblique directions; as a result, the radiation angle characteristics are improved. It is therefore possible to maintain the radiation angle characteristics while enhancing light utilization efficiency.

Second Driving Method

A second driving method is an exemplary method of driving the organic EL display device illustrated in FIG. 6A which includes the pixel configuration illustrated in FIG. 1B and the pixel circuit illustrated in FIG. 6B. M1, M3 and M4 are nMOSs. If M1, M3 and M4 are pMOSs, the H level and the L level should be inverted.

In FIG. 6B, scanning selection signals are input to the scanning lines 26 and information signals (i.e., voltage data, Vdata) representing predetermined gradation are input to the data lines 25 in synchronization with the scanning selection signals. The first electrode 11 of the organic EL device 17a is connected to a drain terminal of M3 and the second electrode 14 is connected to ground potential CGND. The first electrode 11 of the organic EL device 17b is connected to a drain terminal of M4 and the second electrode 14 is connected to ground potential CGND.

When this circuit is selected, the L level signals are input to the selection control lines 37 and 38 and thus M1 is turned on and M3 and M4 are turned off. Since M3 and M4 are not electrically conductive, no electric current flows through the organic EL devices 17a and 17b. The V data applied from the data lines 25 produces voltage in accordance with current drive capacity of M1 in C1 situated between a gate terminal of M2 and power supply potential V1.

Next, when an electric current in accordance with the written V data is supplied to the organic EL device 17a, L level signals are input to the scanning lines 26, H level signals are input to the selection control lines 37 and L level signals are input to the selection control lines 38. At this time, M1 is turned off, M3 is turned on and M4 is turned off. Since only M3 is electrically conductive, with the voltage produced in C1, an electric current in accordance with the current drive capacity of M2 is supplied to the organic EL device 17a and the organic EL device 17a emits light of brightness in accordance with the supplied electric current.

If an electric current is supplied only to the organic EL device 17b, L level signal are input to the scanning lines 26, L level signals are input to the selection control lines 37 and H level signals are input to the selection control lines 38. At this time, M1 is turned off, M3 is turned off and M4 is turned on. Since only M4 is electrically conductive, an electric current in accordance with current drive capacity of M2 is supplied to the organic EL device 17b by the voltage produced in C1; then the organic EL device 17b emits light of brightness in accordance with the supplied electric current.

In this manner, the organic EL devices 17a and 17b can be controlled independently by selecting the H level signals and the L level signals as the signals input to the selection control lines 37 and 38.

It is therefore possible to control the organic EL display device 11 by selecting either of "wide radiation angle characteristic" or "priority on brightness at the top." In this example, the current values supplied to the organic EL devices 17a and 17b are the same.

In this example, as illustrated in FIG. 4B, areas of the apertures of the organic EL device 17Rb, 17Gb and 17Bb in the non-lens regions and areas of the apertures of the organic EL devices 17Ra, 17Ga and 17Ba of the lens regions may differ from each other; i.e., the former is larger than the latter. In this case, desired brightness can be achieved in the organic EL devices 17Rb, 17Gb and 17Bb with a smaller electric current, which contributes a longer lifetime of the organic EL device for a longer lifetime of the organic EL display device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-179136 filed Aug. 10, 2010, which is hereby incorporated by reference herein in its entirety.

What is claimed is:

1. An organic electroluminescence display device comprising a plurality of pixels each of which includes an organic electroluminescence device and a lens, wherein:
   each pixel includes a light emitting region provided with a lens and a light emitting region provided without a lens; and
   the lenses situated in the plurality of pixels are arranged in an alternate pattern.

2. The organic electroluminescence display device according to claim 1, wherein:
   each pixel includes a plurality of organic electroluminescence devices which emit the same colored light; and
   one of the plurality of organic electroluminescence devices is situated in the light emitting region provided with a lens and one of other organic electroluminescence devices is situated in the light emitting region provided without a lens.

3. The organic electroluminescence display device according to claim 1, wherein each pixel includes a single organic electroluminescence device; and the lens is formed on a light emitting surface side of a part of the single organic electroluminescence device.

4. The organic electroluminescence display device according to claim 1, wherein the organic electroluminescence devices are arranged in a striped pattern in accordance with the color of light emitted from a light emitting layer.

5. The organic electroluminescence display device according to claim 1, wherein an area of the light emitting region provided with a lens and an area of the light emitting region provided without a lens differ from each other.

* * * * *